United States Patent
Hashimoto et al.

(10) Patent No.: US 9,723,236 B2
(45) Date of Patent: Aug. 1, 2017

(54) PHOTOELECTRIC CONVERSION APPARATUS AND METHOD FOR DRIVING PHOTOELECTRIC CONVERSION APPARATUS

(71) Applicant: CANON KABUSHIKI KAISHA, Tokyo (JP)

(72) Inventors: Seiji Hashimoto, Yokohama (JP); Hidekazu Takahashi, Zama (JP); Atsushi Furubayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/819,085

(22) Filed: Aug. 5, 2015

(65) Prior Publication Data

US 2016/0044263 A1 Feb. 11, 2016

(30) Foreign Application Priority Data

Aug. 8, 2014 (JP) ................................. 2014-163207

(51) Int. Cl.
*H04N 5/3745* (2011.01)
*H01L 27/146* (2006.01)
*H01L 27/30* (2006.01)

(52) U.S. Cl.
CPC ..... *H04N 5/3745* (2013.01); *H01L 27/14643* (2013.01); *H01L 27/307* (2013.01)

(58) Field of Classification Search
CPC .... H04N 5/3765; H04N 5/3745; H04N 5/374; H01L 27/14643
See application file for complete search history.

(56) References Cited

U.S. PATENT DOCUMENTS

2001/0024844 A1* 9/2001 Kobayashi ........ H01L 27/14658
438/155

FOREIGN PATENT DOCUMENTS

| JP | 8-116044 A | 5/1996 |
|---|---|---|
| JP | 2001-074551 A | 3/2001 |
| JP | 2007-104219 A | 4/2007 |
| JP | 2009-063514 A | 3/2009 |
| JP | 2012-204966 A | 10/2012 |

* cited by examiner

*Primary Examiner* — Ahmed A Berhan
(74) *Attorney, Agent, or Firm* — Canon USA, Inc. IP Division

(57) ABSTRACT

A time at which a potential magnitude relationship between a first electrode and a second electrode is changed from a first relationship to a second relationship in a part of the plurality of pixels and a time at which a potential magnitude relationship between the first electrode and the second electrode is changed from the second relationship to the first relationship in the other part of the plurality of pixels overlap each other.

17 Claims, 11 Drawing Sheets

PHOTOELECTRIC CONVERSION APPARATUS AND METHOD FOR DRIVING PHOTOELECTRIC CONVERSION APPARATUS

BACKGROUND OF THE INVENTION

Field of the Invention

The present invention relates to a photoelectric conversion apparatus and a method for driving a photoelectric conversion apparatus.

Description of the Related Art

Japanese Patent Laid-Open No. 8-116044 discloses a Metal Insulator Semiconductor-type photoelectric conversion unit including a first electrode, a second electrode, and a photoelectric conversion layer between the first electrode and the second electrode. Japanese Patent Laid-Open No. 8-116044 discloses that, in order to discharge signal charges stored in the photoelectric conversion layer, the potential magnitude relationship between the first electrode and the second electrode is reversed from that at the time of the storage of signal charges and is then reversed again to that at the time of the storage of signal charges.

Japanese Patent Laid-Open No. 8-116044 discloses that, in order to reverse the potential magnitude relationship between the first electrode and the second electrode at the time of the storage and discharge of signal charges, a potential different from that supplied at the time of the storage of signal charges is supplied to the first electrode or the second electrode at the time of the discharge of signal charges. When a potential supplied to the first electrode or the second electrode is changed in a plurality of pixels at the same time, a large current passes through a supply line connected to the first electrodes or the second electrodes whose potentials have been changed and the potential of the supply line is changed. Because of this change in the potential of the supply line, the amount of discharge of signal charges varies from pixel to pixel.

The present invention provides a technique for suppressing the effect of a voltage drop at a supply line caused by the change in an inter-electrode voltage.

SUMMARY OF THE INVENTION

A photoelectric conversion apparatus according to an embodiment of the present invention includes a plurality of pixels each including a photoelectric conversion unit and a pixel output unit. The photoelectric conversion unit includes a first electrode, a second electrode, a photoelectric conversion layer that is disposed between the first electrode and the second electrode and is configured to store signal charges, and an insulating layer disposed between the photoelectric conversion layer and the second electrode. An optical signal based on the signal charges stored by the photoelectric conversion unit is output to an input node of the pixel output unit. A time at which a potential magnitude relationship between the first electrode and the second electrode is changed from a first relationship in which a potential of the first electrode is lower than that of the second electrode to a second relationship opposite to the first relationship in a part of the plurality of pixels and a time at which a potential magnitude relationship between the first electrode and the second electrode is changed from the second relationship to the first relationship in the other part of the plurality of pixels overlap each other.

A method for driving a photoelectric conversion apparatus according to an embodiment of the present invention including a plurality of pixels each including a photoelectric conversion unit and a pixel output unit. The photoelectric conversion unit includes a first electrode, a second electrode, a photoelectric conversion layer that is disposed between the first electrode and the second electrode and is configured to store signal charges, and an insulating layer disposed between the photoelectric conversion layer and the second electrode. The method includes outputting an optical signal based on the signal charges stored by the photoelectric conversion unit to an input node of the pixel output unit and making an overlap between a time at which a potential magnitude relationship between the first electrode and the second electrode is changed from a first relationship in which a potential of the first electrode is lower than that of the second electrode to a second relationship opposite to the first relationship in a part of the plurality of pixels and a time at which a potential magnitude relationship between the first electrode and the second electrode is changed from the second relationship to the first relationship in the other part of the plurality of pixels.

Further features of the present invention will become apparent from the following description of exemplary embodiments with reference to the attached drawings.

DESCRIPTION OF THE EMBODIMENTS

Figure 1:
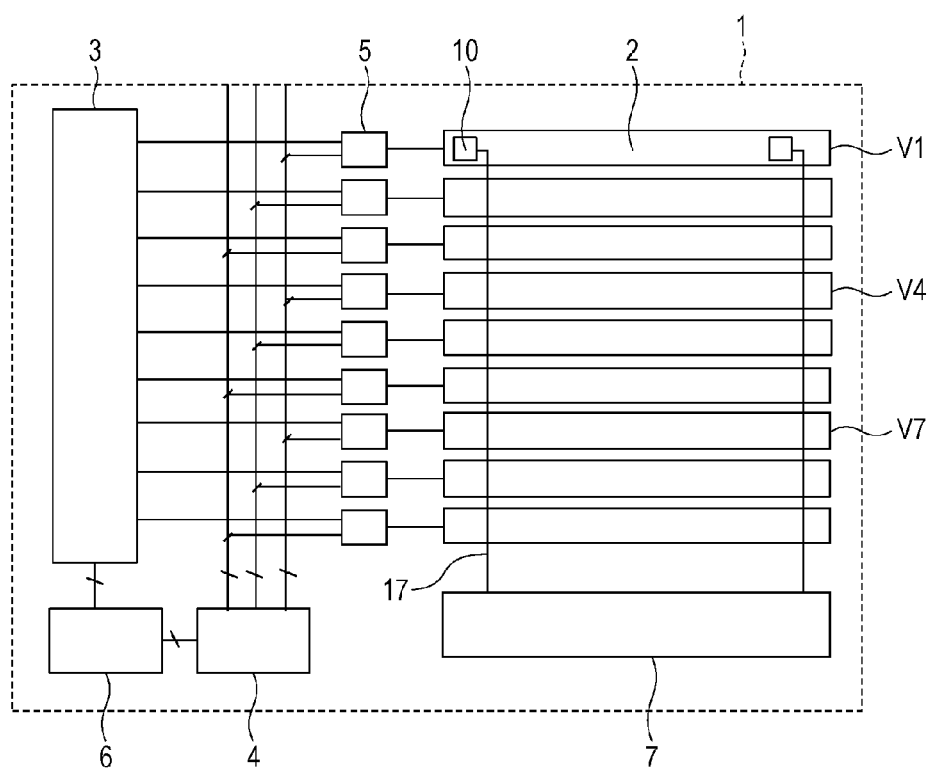
FIG. 1 is a diagram illustrating an exemplary configuration of a photoelectric conversion apparatus.

Embodiments of the present invention will be described below. In the drawings, the same reference numeral is used to represent the same component or the same part so as to avoid repeated explanation.

First Embodiment

FIG. 1 is a diagram illustrating the configuration of a photoelectric conversion apparatus according to the first embodiment.

A photoelectric conversion apparatus 1 includes a plurality of pixel rows 2 of pixels 10. The pixels 10 are arranged in a matrix. The photoelectric conversion apparatus 1 further includes a vertical scanning circuit 3, a driving signal supply unit 4, a plurality of switch units 5 corresponding to the pixel rows 2, a timing generator (hereinafter referred to as TG) 6, a signal processing unit 7, and a plurality of vertical signal lines 17 corresponding to a plurality of columns of the pixels 10.

The driving signal supply unit 4 outputs a control signal to each of the switch units 5. Referring to FIG. 1, the switch units 5 correspond one-to-one to the pixel rows 2. Referring to FIG. 1, the signal processing unit 7 is illustrated in the form of a single block, but includes a plurality of column signal processing circuits corresponding one-to-one to the columns of the pixels 10.

A first pixel row V1, a fourth pixel row V4, and a seventh pixel row V7, which are illustrated in FIG. 1, belong to a first group. A second pixel row, a fifth pixel row, and an eighth pixel row belong to a second group. A third pixel row, a sixth pixel row, and a ninth pixel row belong to a third group. A common signal is supplied from the driving signal supply unit 4 to the pixel rows in the same group.

Figure 2A:
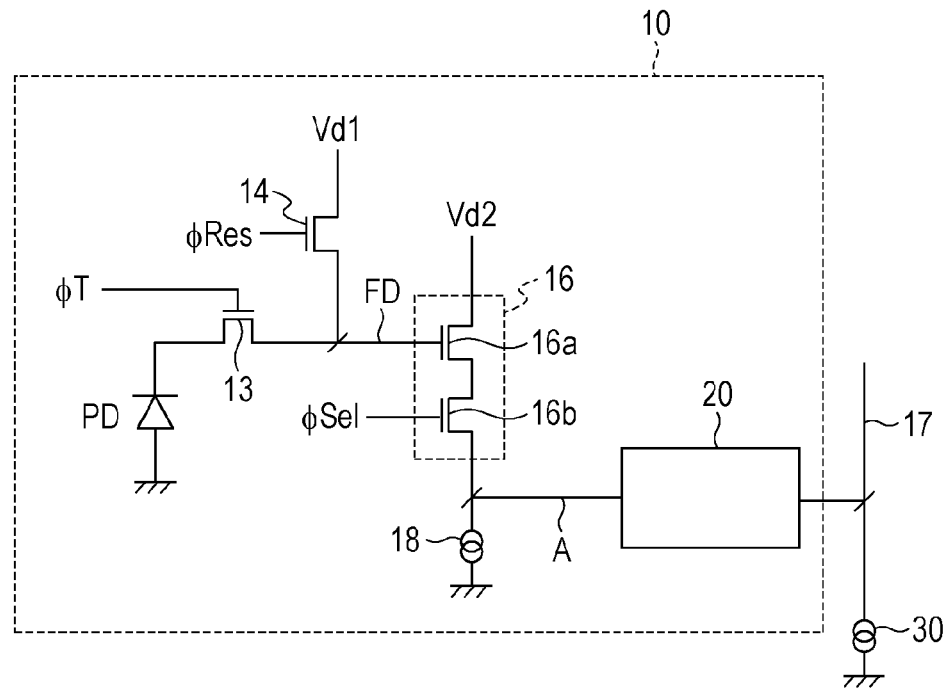
FIG. 2A is a diagram illustrating an exemplary configuration of a pixel.

FIG. 2A illustrates one of the pixels 10 illustrated in FIG. 1. The pixel 10 includes a photodiode PD, a transfer transistor 13, a reset transistor 14, a first pixel output unit 16, a pixel current source 18, and a pixel processing unit 20. The first pixel output unit 16 includes a first amplification transistor 16a and a first selection transistor 16b.

A signal φT transmitted from the switch unit 5 illustrated in FIG. 1 is input into a control node of the transfer transistor 13. A signal φRes transmitted from the switch unit 5 illustrated in FIG. 1 is input into a control node of the reset transistor 14. A voltage Vd1 is input into one of main nodes of the reset transistor 14. A signal φSel transmitted from the switch unit 5 illustrated in FIG. 1 is input into a control node of the first selection transistor 16b.

A voltage Vd2 is input into one of main nodes of the first amplification transistor 16a. The first amplification transistor 16a and the pixel current source 18 form a source follower circuit. Each of the transfer transistor 13, the reset transistor 14, and the first selection transistor 16b is a switch for switching between a conductive state and a nonconductive state in accordance with the signal level of a signal input into a control node.

Figure 2B:
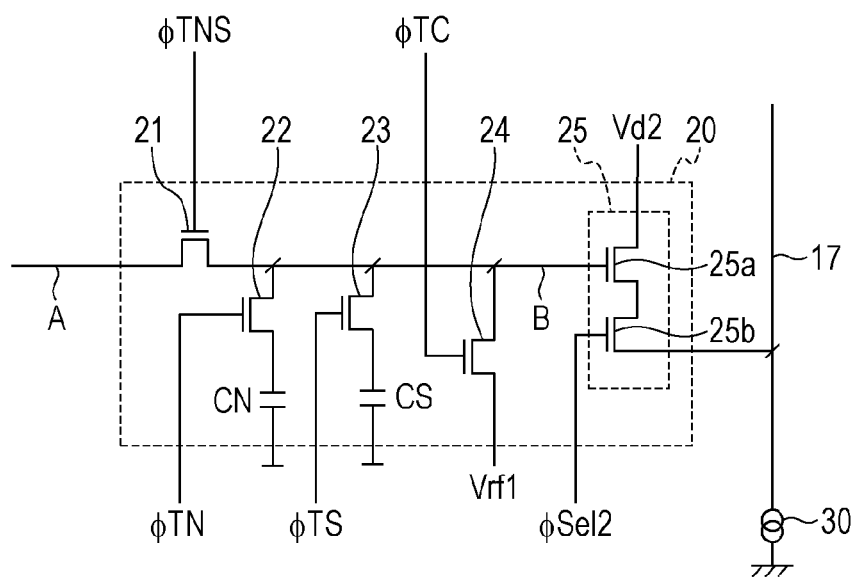
FIG. 2B is a diagram illustrating an exemplary configuration of a pixel processing unit.

FIG. 2B is a diagram illustrating the configuration of the pixel processing unit 20 illustrated in FIG. 2A. The pixel processing unit 20 includes transistors 21, 22, 23, and 24, a second pixel output unit 25, and capacitative elements CN and CS. The second pixel output unit 25 includes a second amplification transistor 25a and a second selection transistor 25b. A voltage Vd2 is input into one of main nodes of the second amplification transistor 25a. The second amplification transistor 25a and a current source 30 for supplying a current to the vertical signal lines 17 form a source follower circuit. A node A is on an electric path between the first selection transistor 16b and the transistor 21.

A signal φTNS transmitted from the switch unit 5 is input into a control node of the transistor 21. A signal φTN transmitted from the switch unit 5 is input into a control node of the transistor 22. A signal φTS transmitted from the switch unit 5 is input into a control node of the transistor 23. A signal φTC transmitted from the switch unit 5 is input into a control node of the transistor 24. A voltage Vrf1 is input into one of main nodes of the transistor 24. A signal φSel2 transmitted from the switch unit 5 is input into one of main nodes of the second selection transistor 25b.

Figure 3:
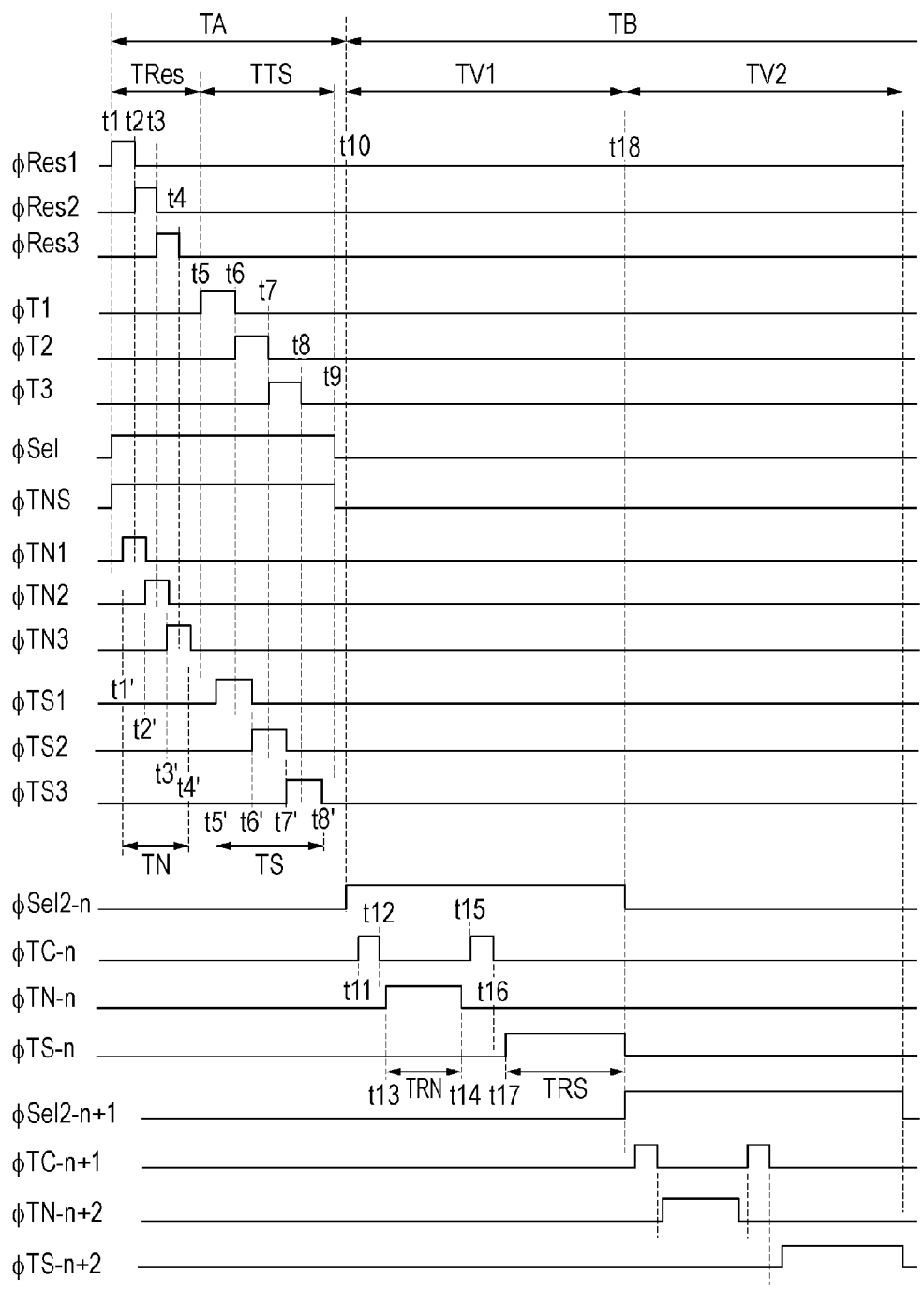
FIG. 3 is a diagram illustrating an exemplary operation of a photoelectric conversion apparatus.

FIG. 3 is a timing diagram illustrating the operation of the photoelectric conversion apparatus illustrated in FIG. 1.

Signals φRes1 and φT1 illustrated in FIG. 3 are supplied to the pixels 10 in the first group and correspond to the signals φRes and φT illustrated in FIG. 2A, respectively. Signals φTN1 and φTS1 illustrated in FIG. 3 are supplied to the pixels 10 in the first group and correspond to the signals φTN and φTS illustrated in FIG. 2B, respectively.

Signals φRes2 and φT2 illustrated in FIG. 3 are supplied to the pixels 10 in the second group and correspond to the signals φRes and φT illustrated in FIG. 2A, respectively. Signals φTN2 and φTS2 illustrated in FIG. 3 are supplied to the pixels 10 in the second group and correspond to the signals φTN and φTS illustrated in FIG. 2B, respectively.

Signals φSel and φTNS are common signals supplied to all rows of the pixels 10 illustrated in FIG. 1.

Signals φSel2, φTC, φTN, and φTS are supplied to each row of the pixels 10. The "–n" attached to the signals denotes that the signals are supplied to the pixels 10 in the nth row in FIG. 3. In this embodiment, descriptions will be made assuming that n=1.

In the operation illustrated in FIG. 3, the driving signal supply unit 4 sequentially changes the signal levels of the signals φRes1, φRes2, and φRes3, which are to be transmitted to corresponding groups of the pixels 10, from Lo to Hi. Furthermore, the driving signal supply unit 4 sequentially changes the signal levels of the signals φT1, φT2, and φT3, which are to be transmitted to corresponding groups of the pixels 10, from Lo to Hi. As compared with rolling shutters for sequentially scanning rows of the pixels 10, the operation illustrated in FIG. 3 reduces the difference in exposure timing between rows of the pixels 10. The operation illustrated in FIG. 3 can be regarded as a pseudo-global shutter.

A period TA includes periods TRes and TTS. In the period TRes, the driving signal supply unit 4 sequentially changes the signal levels of the signals φRes1, φRes2, and φRes3 from Lo to Hi. As a result, the potentials of nodes FD of the pixels 10 in the first group, the second group, and the third group are reset in accordance with the voltage Vd1. The driving signal supply unit 4 sequentially changes the signal levels of the signals φTN1, φTN2, and φTN3 from Lo to Hi. As a result, in each pixel 10 in all rows illustrated in FIG. 1, the capacitative element CN stores a signal that is output from the first amplification transistor 16a after the reset of the node FD has been canceled. The signal output from the first amplification transistor 16a and the signal stored in the capacitative element CN are denoted as noise signals.

In the period TRes, as illustrated in FIG. 3, a period in which the driving signal supply unit 4 sets the signal level of the signal φRes1 to Hi and a period in which the driving signal supply unit 4 sets the signal level of the signal φTN1 to Hi partially overlap. That is, in a photoelectric conversion apparatus according to this embodiment, the pixel processing unit 20 samples a noise signal in a period in which the node FD is reset. As compared with a configuration in which the pixel processing unit 20 starts to sample a noise signal after the reset of the node FD has been completed, the dark current component of the node FD included in a noise signal can be reduced with this configuration.

In a period TN, the driving signal supply unit 4 sequentially sets the signal levels of the signals φTN1, φTN2, and φTN3 to Hi. As a result, the output of a noise signal to the capacitative element CN is sequentially performed in the three groups of the pixels 10.

In this embodiment, at a time t2, the signal level of the signal φRes1 is changed from Hi to Lo and the signal level of the signal φRes2 is changed from Lo to Hi. At a time t3, the signal level of the signal φRes2 is changed from Hi to Lo and the signal level of the signal φRes3 is changed from Lo to Hi.

In the period TTS, the driving signal supply unit 4 sequentially changes the signal levels of the signals φT1, φT2, and φT3 from Lo to Hi. As a result, the node FD in each pixel 10 in all rows has a potential based on charges transmitted from the photodiode PD. The driving signal supply unit 4 sequentially changes the signal levels of the signals φTS1, φTS2, and φTS3 from Lo to Hi. As a result, in each pixel 10 in all rows illustrated in FIG. 1, the capacitative element CS stores a signal output from the first amplification transistor 16a in accordance with the potential of the node FD based on the charges transferred from the photodiode PD. The signal output from the first amplification transistor 16a and the signal stored by the capacitative element CS are denoted as optical signals.

In the period TTS, as illustrated in FIG. 3, a period in which the driving signal supply unit 4 sets the signal level of the signal φT1 to Hi and a period in which the driving signal supply unit 4 sets the signal level of the signal φTS1 to Hi partially overlap. That is, in a photoelectric conversion apparatus according to this embodiment, the pixel processing unit 20 samples an optical signal in a period in which charges are transferred from the photodiode PD to the node FD. As compared with a configuration in which the pixel processing unit 20 starts to sample an optical signal after charges have been transferred from the photodiode PD to the node FD, the dark current component of the node FD included in the optical signal can be reduced with this configuration.

In a period TB, a noise signal and an optical signal are output from each row of the pixel 10 and input into a corresponding column signal processing circuit in the signal processing unit 7 via the vertical signal line 17. The column signal processing circuit externally outputs from a photoelectric conversion apparatus according to this embodiment a signal obtained by subtracting the noise signal from the optical signal. As a result, the photoelectric conversion apparatus can output a signal whose signal-to-noise ratio is better than that of an optical signal.

The period TB includes a period TV1 in which the pixels 10 in the first row (n=1) operate, and the period TV1 will be described.

The capacitative element CN in each pixel 10 in the first row stores a noise signal. The capacitative element CS in each pixel 10 in the first row stores an optical signal.

In a period from a time t10 to a time t18, the vertical scanning circuit 3 sets the signal level of the signal φSel2-n to Hi, so that the second selection transistor 25b in each pixel 10 in the first row is turned on. This allows the second pixel output unit 25 to output a signal to the corresponding vertical signal line 17.

In a period from a time t11 to a time t12, the vertical scanning circuit 3 sets the signal level of the signal φTC-n to Hi, so that the transistor 24 is turned on. As a result, the potential of a node B that is the gate of the second amplification transistor 25a is reset to the potential of the voltage Vrf1.

In a period TRN from a time t13 to a time t14, the vertical scanning circuit 3 sets the signal level of the signal φTN-n to hi, so that the transistor 22 is turned on. As a result, a noise signal is input into a column signal processing circuit via the second pixel output unit 25 and the vertical signal line 17. Subsequently, the vertical scanning circuit 3 sets the signal level of the signal φTC-n to Hi again, so that the potential of the node B is reset. Subsequently, the vertical scanning circuit 3 sets the signal level of the signal φTS-n to Hi, so that the transistor 23 is turned on. As a result, an optical signal is output to the column signal processing circuit via the second pixel output unit 25 and the vertical signal line 17.

In the period TB, a photoelectric conversion apparatus according to this embodiment performs this operation of the period TV1 for each row of the pixels 10. The pixels 10 in each row sequentially outputs optical signals and noise signals to the column signal processing circuit.

As described previously, in a photoelectric conversion apparatus according to this embodiment, the pixel processing unit 20 samples a noise signal while the node FD is reset. The dark current component of the node FD included in a noise signal can therefore be reduced. In addition to this effect and the above-described effect of reducing the dark current component of the node FE included in an optical signal, a photoelectric conversion apparatus according to this embodiment has the following effect.

In this embodiment, the pixels 10 are divided into a plurality of groups and a time at which the signal level of a driving signal is changed varies from group to group. When the signal φRes, which is one of driving signals, is supplied to the pixels 10 in all rows, the nodes FD in the pixels 10 in all rows are electrically connected to the corresponding power sources Vd1 at the same time. A current flows between the node FD and the power source Vd1 in the pixels 10 in all rows at the same time, so that the potential of the power source Vd1 is changed. This change in the potential of the power source Vd1 temporarily changes the potential of the node FD after the reset. The temporary change in the potential of the node FD changes the potential of a noise signal stored in the capacitative element CN. On the other hand, the first amplification transistor 16a outputs an optical signal in a state where the temporary change in the potential of the node FD is reduced as compared with a period in which the first amplification transistor 16a outputs a noise signal. The signal level of a noise component included in a noise signal and the signal level of a noise component included in an optical signal therefore differ from each other. The column signal processing circuit cannot accurately subtract the noise signal from the optical signal. In a photoelectric conversion apparatus according to this embodiment, the time at which the signal level of the signal φRes, which is one of driving signals, is changed from Lo to hi varies from group to group. The pixels 10 in all rows are subjected to the reset of the potential of the node FD in units of groups, and are therefore electrically connected to the corresponding power sources Vd1 in units of groups. Accordingly, as compared with a case where the pixels 10 in all rows are electrically connected to the corresponding power sources Vd1 at the same time, the amount of change in the potential of the power source Vd1 can be reduced in a photoelectric conversion apparatus according to this embodiment. That is, the amount of change in the potential of a noise signal can be reduced, the signal level of a noise component included in an optical signal and the signal level of a noise component included in a noise signal can be easily made to conform to each other, and the column signal processing circuit can output a signal obtained by accurately subtracting the noise signal from the optical signal.

In this embodiment, the pixels 10 are divided into three groups. In a photoelectric conversion apparatus according to this embodiment, the number of groups is not limited, and may be from two to X inclusive assuming that the number of the pixels 10 is X.

In a photoelectric conversion apparatus according to this embodiment, the column signal processing circuit in the signal processing unit 7 obtains the difference between an optical signal and a noise signal. In this embodiment, however, the photoelectric conversion apparatus may externally output the noise signal and the optical signal and the difference between them may be obtained outside the photoelectric conversion apparatus. When the signal processing unit 7 includes an output unit for externally outputting signals sequentially output from a plurality of column signal processing circuits, the output unit may obtain the difference between an optical signal and a noise signal. The column signal processing circuit may include a clamp capacitor for storing a noise signal. In this case, an optical signal is output to a circuit at a subsequent stage via the clamp capacitor storing a noise signal. A signal of the difference between the optical signal and the noise signal is output to the circuit subsequent to the clamp capacitor.

The configuration of the pixel processing unit 20 according to this embodiment is not limited to the configuration illustrated in FIG. 2B. Other configurations of the pixel processing unit 20 will be described.

Figure 9A:
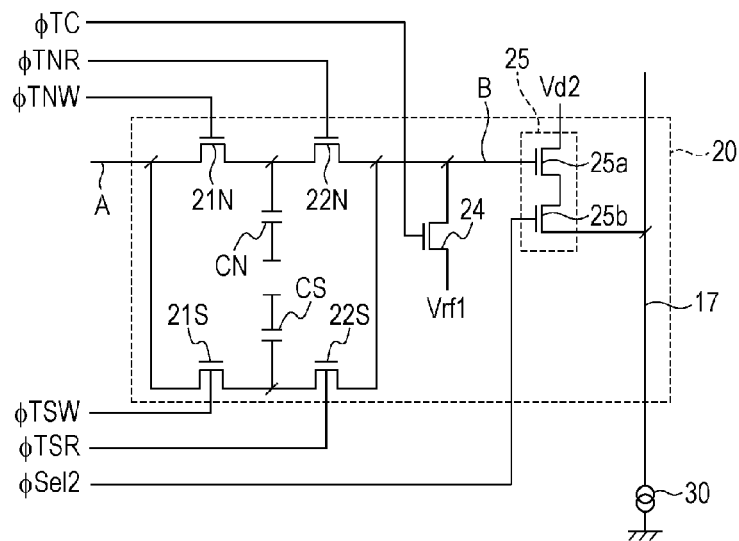
FIG. 9A is a diagram illustrating another exemplary configuration of a pixel processing unit.
Figure 9B:
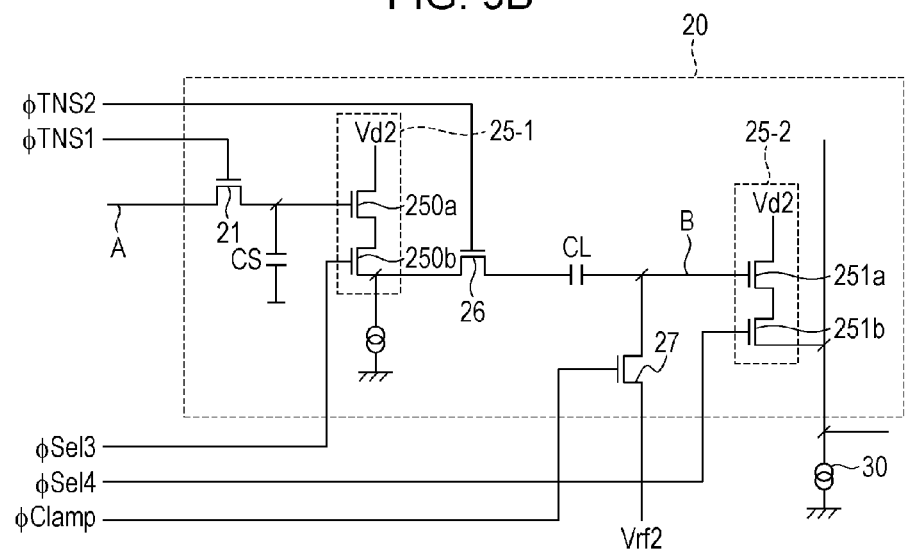
FIG. 9B is a diagram illustrating another exemplary configuration of a pixel processing unit.

FIGS. 9A and 9B are diagrams illustrating the configurations of the pixel processing unit 20. Referring to FIGS. 9A and 9B, the same reference numerals are used to identify parts already described with reference to FIG. 2B.

The pixel processing unit 20 illustrated in FIG. 9A will be described. The capacitive element CN is electrically connected to an electric path between a transistor 21N and a transistor 22N. The capacitive element CS is electrically connected to an electric path between a transistor 21S and a transistor 22S. The transistors 21N and 21S are electrically connected to the same node A. The transistors 22N and 22S are electrically connected to the same node B. Signals φTNW, φTNR, φTSW, and φTSR are supplied from the driving signal supply unit 4 to the gates of the transistors 21N, 22N, 21S, and 22S, respectively.

The waveform of the signal φTNW for the pixels 10 in the first group is the same as that of the signal φTN1 illustrated in FIG. 3. The waveform of the signal φTNW for the pixels 10 in the second group is the same as that of the signal φTN2 illustrated in FIG. 3. The waveform of the signal φTNW for the pixels 10 in the third group is the same as that of the signal φTN3 illustrated in FIG. 3.

The waveform of the signal φTSW for the pixels 10 in the first group is the same as that of the signal φTS1 illustrated in FIG. 3. The waveform of the signal φTSW for the pixels 10 in the second group is the same as that of the signal φTS2 illustrated in FIG. 3. The waveform of the signal φTSW for the pixels 10 in the third group is the same as that of the signal φTS3 illustrated in FIG. 3.

The waveform of the signal φTNR for the pixels 10 in the nth row is the same as that of the signal φTN-n illustrated in FIG. 3. The waveform of the signal φTNR for the pixels 10 in the (n+1)th row is the same as that of the signal φTN-n+1 illustrated in FIG. 3.

The waveform of the signal φTSR for the pixels 10 in the nth row is the same as that of the signal φTS-n illustrated in FIG. 3. The waveform of the signal φTSR for the pixels 10 in the (n+1)th row is the same as that of the signal φTS-n+1 illustrated in FIG. 3.

Thus, the pixel processing unit 20 illustrated in FIG. 9A can output a noise signal and an optical signal to the vertical signal line 17.

Next, the pixel processing unit 20 illustrated in FIG. 9B will be described. Referring to FIG. 9B, a capacitative element CL clamps a noise signal.

The pixel processing unit 20 includes a third pixel output unit 25-1 and a fourth pixel output unit 25-2. The third pixel output unit 25-1 includes a third amplification transistor 250a and a third selection transistor 250b. The input node of the third amplification transistor 250a is electrically connected to the capacitative element CS and the transistor 21. A third amplification transistor 250b is electrically connected to a transistor 26. The transistor 26 is electrically connected to one node of the capacitative element CL. The other node of the capacitative element CL is electrically connected to a fourth amplification transistor 251a included in the fourth pixel output unit 25-2 via the node B and is further electrically connected to a transistor 27. A signal φClamp output from the driving signal supply unit 4 is input into the gate of the transistor 27. In addition, a voltage Vrf2 is input into the transistor 27.

The fourth pixel output unit 25-2 includes a fourth selection transistor 251b.

A signal φSel3 transferred from the vertical scanning circuit 3 is input into the gate of the third selection transistor 250b. A signal φSel4 transferred from the vertical scanning circuit 3 is input into the gate of the fourth selection transistor 251b.

Figure 10:
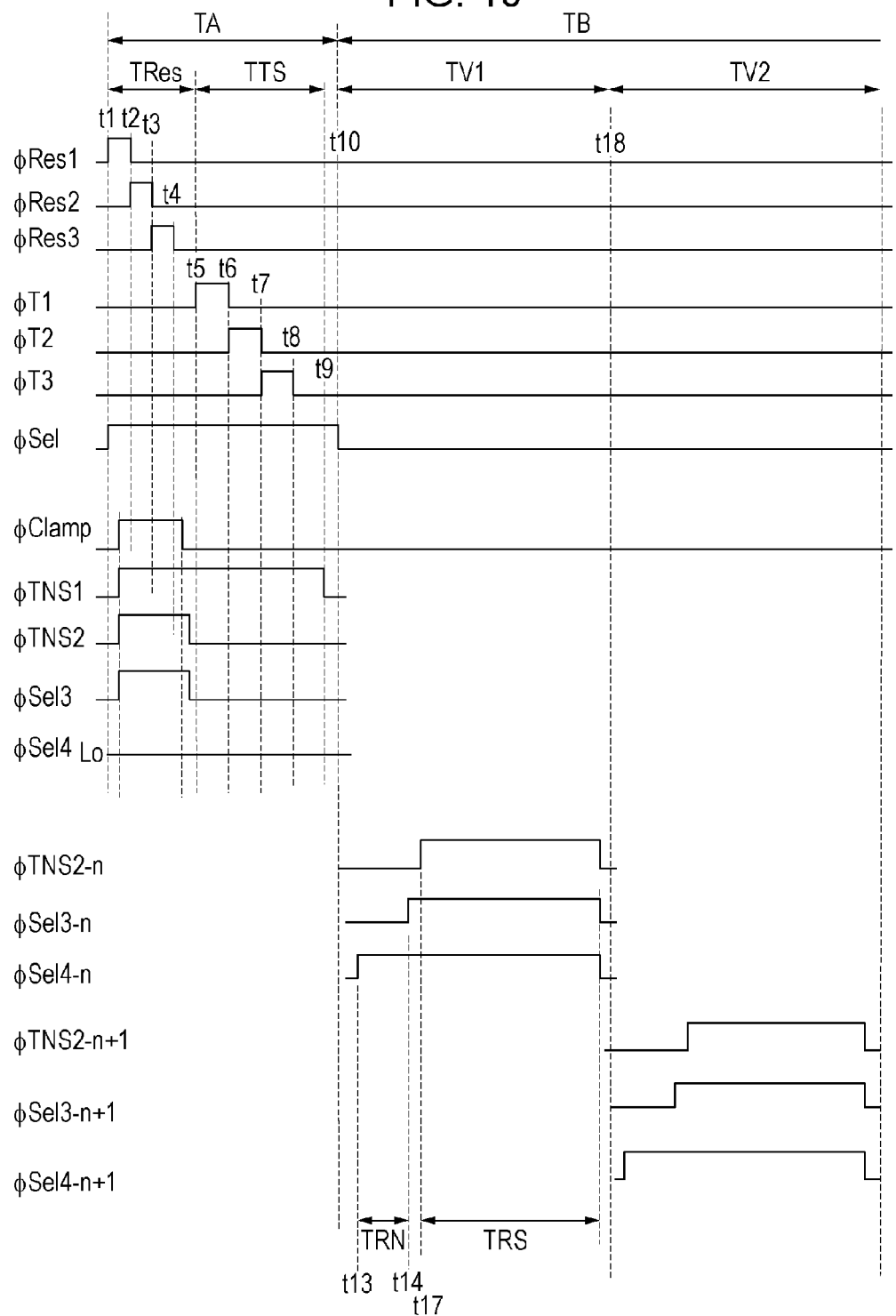
FIG. 10 is a diagram illustrating another exemplary configuration of a photoelectric conversion apparatus.

FIG. 10 is a timing diagram illustrating the operation of a photoelectric conversion apparatus including the pixel processing unit 20 illustrated in FIG. 9B. Each of the switch units 5 includes a plurality of AND circuits for receiving signals from the vertical scanning circuit 3 and the driving signal supply unit 4. Signals φTNS2, φSel3, and φSel4 are output from the corresponding AND circuits in the switch unit 5. In the period TA, the vertical scanning circuit 3 sets the signal levels of signals to be output to the AND circuits for outputting corresponding signals φTNS1, φTNS2, φSel3, and φSel4 to Hi. Accordingly, the signal levels of the signals φTNS1, φTNS2, φSel3, and φSel4 are determined in accordance with the signal level of a signal output from the driving signal supply unit 4 in the period TA. In the period TB, the vertical scanning circuit 3 sequentially changes the signal levels of signals to be output the AND circuits for outputting corresponding signals φTNS2, φSel3, and φSel4 from Lo to Hi in units of the pixel rows 2. On the other hand, in the period TB, the driving signal supply unit 4 keeps the signal levels of signals to be output the AND circuits for outputting corresponding signals φTNS1, φTNS2, φSel3, and φSel4 Hi. Accordingly, in the period TB, the signal levels of the signals φTNS1, φTNS2, φSel3, and φSel4 are determined in accordance with the signal level of a signal output from the vertical scanning circuit 3.

When the signal level of the signal φClamp is changed from Hi to Lo, the capacitative element CL in each of the pixels 10 in all rows clamps a noise signal. In the period TB, in order from the pixels 10 in the nth row, the fourth pixel output unit 25-2 outputs a signal based on a signal obtained by causing the capacitative element CL to subtract a noise signal from an optical signal to the vertical signal line 17.

Thus, a photoelectric conversion apparatus including the pixel processing unit 20 illustrated in FIG. 9A or 9B also can obtain the same effect as a photoelectric conversion apparatus including the pixel processing unit 20 illustrated in FIG. 2B.

Second Embodiment

In a configuration according to this embodiment, a plurality of pixels each including a photoelectric conversion unit and a pixel output unit are provided. The photoelectric conversion unit includes a first electrode, a second electrode, a photoelectric conversion layer for storing signal charges which is disposed between the first electrode and the second electrode, and an insulating layer disposed between the photoelectric conversion layer and the second electrode. The switching between a storage operation of storing signal charges in the photoelectric conversion unit and a discharge operation of discharging the signal charges from the photoelectric conversion unit can be performed in accordance with a voltage applied between the first electrode and the second electrode.

Difference points between the first embodiment and the second embodiment will be mainly described below. The configuration of a photoelectric conversion apparatus according to this embodiment is the same as that illustrated in FIG. 1.

Figure 4A:
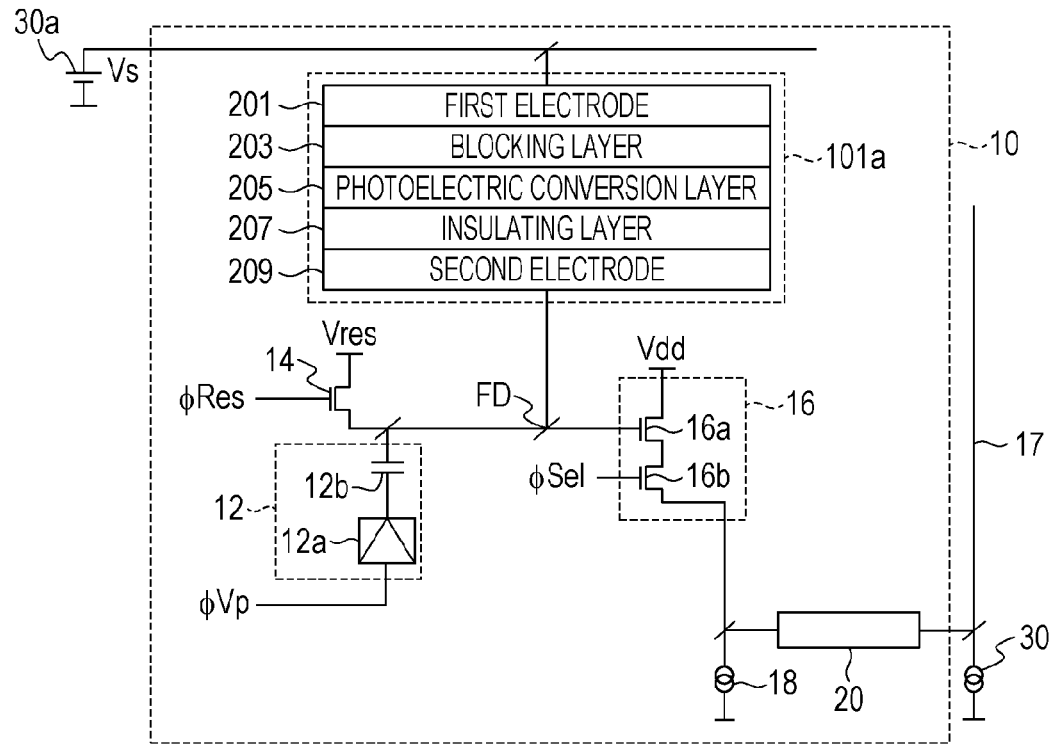
FIG. 4A is a diagram illustrating another exemplary configuration of a pixel.

The pixel 10 illustrated in FIG. 4A includes a capacitor driving unit 12, the vertical signal line 17, the current source 18, and the pixel processing unit 20. A potential Vs is supplied from a power source unit 30a to a first electrode 201.

FIG. 4A illustrates one of the pixels 10 arranged in a plurality of rows and a plurality of columns. Referring to FIG. 4A, one of the vertical signal lines 17, one of the current sources 18, and one of the pixel processing units 20 are illustrated. The pixel 10 includes a photoelectric conversion unit 101a. The photoelectric conversion unit 101a includes the first electrode 201, a blocking layer 203, a photoelectric conversion layer 205, an insulating layer 207, and a second electrode 209. The blocking layer 203 is disposed between the first electrode 201 and the photoelectric conversion layer 205. The photoelectric conversion layer 205 is disposed between the blocking layer 203 and the insulating layer 207. The insulating layer 207 is disposed between the photoelectric conversion layer 205 and the second electrode 209.

The first electrode 201 is composed of a conductive member having a high transmittance of light in a wavelength band in which the photoelectric conversion layer 205 has sensitivity. For example, examples of a material for the first electrode 201 include indium such as Indium Tin Oxide (ITO), a compound containing tin, and a compound such as Zno. The photoelectric conversion layer 205 according to this embodiment can let in more light as compared with a case in which an electrode composed of an opaque material such as copper is used as the first electrode 201. The first electrode 201 according to this embodiment may be composed of polysilicon or a metal having a thickness that is thin enough to transmit a predetermined amount of light.

The blocking layer 203 prevents charges of the same conductive type as signal charges stored in the photoelectric conversion layer 205 from being transferred from the first electrode 201 to the photoelectric conversion layer 205. The photoelectric conversion layer 205 is depleted in accordance with the difference between a potential Vs applied to the first electrode 201 and the potential of the second electrode 209. The potential gradient of the photoelectric conversion layer 205 is inverted in accordance with the relationship between the potential Vs applied to the first electrode 201 and the potential of the second electrode 209. With such a configuration, the photoelectric conversion layer 205 can store signal charges and discharge stored signal charges. The operation of the photoelectric conversion unit 101a will be described later.

In this embodiment, a power source voltage supplied to the first electrode 201 is the potential VS supplied from the power source unit 30a.

The photoelectric conversion layer 205 is composed of intrinsic amorphous silicon (hereinafter referred to as a-Si), P-type a-Si of a low impurity concentration, or N-type a-Si of a low impurity concentration. Alternatively, the photoelectric conversion layer 205 may be composed of a compound semiconductor, for example, a III-V compound semiconductor such as BN, GaAs, GaP, AlSb, or GaAlAsP, a II-VI compound semiconductor such as CdSe, ZnS, or HdTe, or a IV-VI compound semiconductor such as PbS, PbTe, or CuO. Alternatively, the photoelectric conversion layer 205 may be composed of an organic material such as fullerene, coumarin 6 (C6), rhodamine 6G (R6G), zinc phthalocyanine (ZnPc), quinacridon, a phthalocyanine compound, or a naphthalocyanine compound. As the photoelectric conversion layer 205, a quantum dot film including the above-described compound semiconductor may be used.

In one embodiment, when the photoelectric conversion layer 205 is composed of a semiconductor, the semiconductor has a low impurity concentration or is an intrinsic semiconductor. With such a configuration, a depletion layer can sufficiently extend in the photoelectric conversion layer 205. This leads to sensitivity enhancement and noise reduction.

As a material for the blocking layer 203, an N-type or P-type semiconductor that is the same material as the photoelectric conversion layer 205 and has an impurity concentration higher than that of the material for the photoelectric conversion layer 205 can be used. For example, when the photoelectric conversion layer 205 is composed of a-Si, the blocking layer 203 is composed of N-type or P-type a-Si into which an impurity is doped. Since the difference in an impurity concentration leads to the difference in the position of the Fermi level, the blocking layer 203 functions as a potential barrier only to either electrons or holes. When the photoelectric conversion layer 205 includes a quantum dot film, the blocking layer 203 may be composed of the same material as the quantum dot film and has a conductive type opposite to that of the quantum dot film. For example, when the quantum dot film is a P-type Pbs, the blocking layer 203 may be an N-type PbS. Even in a case where blocking layer 203 is composed of the same material as the quantum dot film and has the same conductive type as the quantum dot film, the impurity concentrations of the quantum dot film and the blocking layer 203 may be made to differ from each other.

Alternatively, a material different from the material for the photoelectric conversion layer 205 may be used for the blocking layer 203. In this case, a heterojunction is formed. Since the difference in material leads to the difference in band gap, a potential barrier only to either electrons or holes can be formed. When the photoelectric conversion layer 205 includes a quantum dot film, for example, the quantum dot film may be composed of PbS and the blocking layer 203 may be composed of ZnO.

The insulating layer 207 is disposed between the photoelectric conversion layer 205 and the second electrode 209. Examples of a material for the insulating layer 207 include amorphous silicon oxide (hereinafter referred to as a-SiO), amorphous silicon nitride (hereinafter referred to as a-SiN), and an organic material. In one embodiment, the insulating layer 207 has a thickness with which the penetration of signal charges by the tunnel effect is inhibited. Such a configuration reduces a leak current. This leads to noise reduction. More specifically, the thickness of the insulating layer 207 is equal to or greater than 50 nm.

When an amorphous film is used for the blocking layer 203, the photoelectric conversion layer 205, and the insulating layer 207, hydrogen treating may be performed so as to terminate dangling bonds with hydrogen. With such a configuration, noise reduction can be achieved.

The second electrode 209 is composed of a conductive member such as metal. The second electrode 209 is composed of the same conductive member as lines or a pad electrode used for external connection. In the photoelectric conversion unit 101a according to this embodiment, the second electrode 209 and lines or the pad electrode can therefore be formed at the same time. That is, the photoelectric conversion unit 101a according to this embodiment can be more simply manufactured than a photoelectric conversion unit including the second electrode 209 composed of a material different from the conductive member of lines or a pad electrode.

The first electrode 201 of the photoelectric conversion unit 101a is electrically connected to the power source unit 30a. The power source unit 30a supplies the potential Vs to the first electrode 201. One of the source and drain of the reset transistor 14 receives a reset potential Vres and the other one of them is electrically connected to the node FD. The reset potential Vres is lower than the potential Vs. In this embodiment, the potential Vs is 5 V and the reset potential Vres is 2 V.

The capacitor driving unit 12 includes a buffer circuit 12a and a capacitative element 12b. A first node that is one node of the capacitative element 12b is electrically connected to the node FD that is a third node. The first node of the capacitative element 12b is further electrically connected to the second electrode 209 of the photoelectric conversion unit 101a. A second node that is the other node of the capacitative element 12b is electrically connected to the buffer circuit 12a. A signal φVp transferred from the driving signal supply unit 4 is input into the buffer circuit 12a. The buffer circuit 12a buffers the potential of the signal φVp and supplies a resultant potential to the capacitative element 12b. The driving signal supply unit 4 is a potential supply unit for supplying the signals φVp having different potentials to the capacitative element 12b via the buffer circuit 12a.

The capacitative element 12b is electrically connected to the node FD. The capacitative element 12b includes, for example, two electrodes that face each other and are composed of polysilicon or metal. Alternatively, the capacitative element 12b includes a semiconductor region and a gate electrode disposed on the semiconductor region.

The connection of the capacitative element 12b to the node FD can reduce noise when an optical signal is read from the photoelectric conversion unit 101a. The effect of this noise reduction will be described.

A photoelectric conversion apparatus according to this embodiment controls the potential of the node FD. The potential of the second electrode 209 in the photoelectric conversion unit 101a varies in accordance with the ratio between the capacitance value of the node FD and the capacitance value of a capacitance component between the first electrode 201 and the second electrode 209 (hereinafter referred to as the capacitance value of the photoelectric conversion unit 101a). The reason for this is that the node FD and the photoelectric conversion unit 101a can be regarded as two series-connected capacitors.

In a photoelectric conversion apparatus according to this embodiment, the larger the capacitance value of the node FD, the larger the amount of change in the potential of the second electrode 209 when the potential of the node FD is changed.

In this embodiment, the capacitative element 12b is electrically connected to the node FD. The capacitance value of the node FD can be substantially increased by the capacitance value of the capacitative element 12b. Accordingly, when the potential of the second electrode 209 is controlled so as to read an optical signal from the photoelectric conversion unit 101a, a large potential difference can be applied between the first electrode 201 and the second electrode 209. A photoelectric conversion apparatus according to this embodiment can therefore easily depletes the photoelectric conversion layer 205. This leads to the reduction in the signal level of a noise component in an optical signal.

A signal transferred from the first amplification transistor 16a via the selection transistor 16b is input into the pixel processing unit 20. The configuration of the pixel processing unit 20 is the same as that illustrated in FIG. 2B.

Next, the operation of the photoelectric conversion unit 101a according to this embodiment will be described. FIGS. 5A to 5D are schematic diagrams illustrating energy bands in the photoelectric conversion unit 101a. Referring to FIGS. 5A to 5D, the energy bands of the first electrode 201, the blocking layer 203, the photoelectric conversion layer 205, the insulating layer 207, and the second electrode 209 are illustrated. A vertical axis in FIG. 5 represents a potential relative to electrons. The nearer to the top of FIG. 5, the higher the potential relative to electrons. The nearer to the bottom of FIG. 5, the lower the potential. The Fermi levels of the first electrode 201 and the second electrode 209 are illustrated. Regarding the blocking layer 203 and the photoelectric conversion layer 205, a band gap between the energy level of the conduction band and the energy level of the valence band is illustrated.

The photoelectric conversion unit 101a repeatedly performs the following process. The process includes steps (1) the reset of an input node of an amplification unit, (2) the reading of a noise signal, (3) the transfer of signal charges from a photoelectric conversion unit, (4) the reading of an optical signal, and (5) the storage of signal charges. These steps will be described below.

Figure 5A:
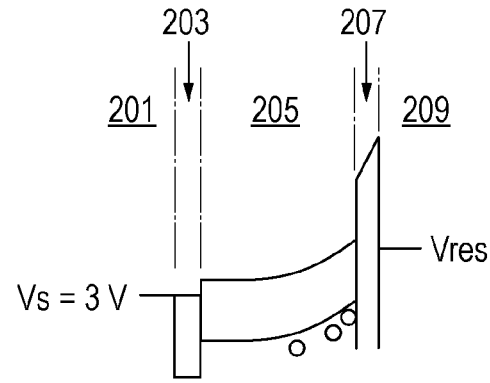
FIGS. 5A to 5D are diagrams illustrating an exemplary operation of a photoelectric conversion unit.

FIG. 5A illustrates the state of the photoelectric conversion unit 101a in steps (1) and (2). The potential Vs is supplied to the first electrode 201. The first potential Vs is, for example, 3 V. The photoelectric conversion layer 205 stores holes represented by white circles as signal charges generated during exposure. The surface potential of the photoelectric conversion layer 205 on the side of the insulating layer 207 changes in accordance with the number of stored holes. The buffer circuit 12a supplies a first potential Vd1 to the capacitative element 12b. The first potential Vd1 is, for example, 0 V.

In this state, the reset transistor 14 is turned on. As a result, the potential of a node including the second electrode 209, that is, the potential of the node FD, is reset to the reset potential Vres. The reset potential Vres is, for example, 1 V. Since the node FD is connected to the gate (input node) of the first amplification transistor 16a, the input node of an amplification unit is reset.

Subsequently, the reset transistor 14 is turned off. The node FD is brought into an electrically floating state. At that time, a reset noise may occur at the reset transistor 14. At that time, holes of signal charges remain stored in the photoelectric conversion layer 205.

The selection transistor 16b is turned on, so that the first amplification transistor 16a outputs a noise signal including the reset noise.

Figure 5B:
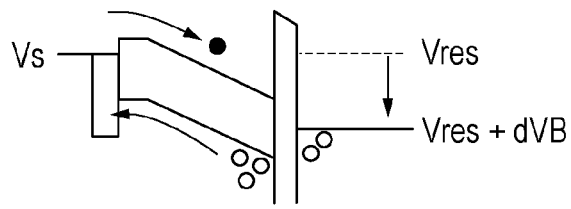
Figure 5C:
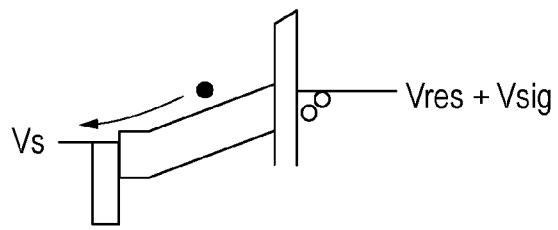

FIGS. 5B and 5C illustrates the state of the photoelectric conversion unit 101a in step (3). First, the buffer circuit 12a supplies a second potential Vd2 to the capacitative element 12b. Since holes are used as signal charges, the second potential Vd2 is higher than the first potential Vd1. The second potential Vd2 is, for example, 5 V.

At that time, the potential of the second electrode 209 (the node FD) changes in the same direction in which a potential supplied by the buffer circuit 12a changes. The amount of change dVB in the potential of the second electrode 209 is determined in accordance with the ratio between a capacitance value C1 of the capacitative element 12b electrically connected to the node FD and a capacitance value C2 of the photoelectric conversion unit 101a. The amount of change dVB is represented by the following equation.

$$dVB=(Vd2-Vd1)\times C1/(C1+C2) \qquad (1)$$

Here, for the simplification of explanation, the assumption that the capacitance values C1 and C2 are equal.
The amount of change dVB is therefore represented by the following equation.

$$dVB=(Vd2-Vd1)\times(\tfrac{1}{2}) \qquad (2)$$

In this embodiment, the amount of change dVB in the potential of the second electrode 209 is sufficiently larger than the difference (Vs−Vres) between the potential Vs of the first electrode 201 and the reset potential Vres. Accordingly, the potential of the second electrode 209 is lower than that of the first electrode 201 and the potential gradient of the photoelectric conversion layer 205 is inverted. Electrons represented by a black circle are therefore injected from the first electrode 201 into the photoelectric conversion layer 205. All or part of the holes stored in the photoelectric conversion layer 205 as signal charges move to the blocking layer 203. The moved holes recombine with many carriers in the blocking layer 203 and disappear. As a result, holes are discharged from the photoelectric conversion layer 205. When the photoelectric conversion layer 205 is entirely depleted, all of holes stored as signal charges are discharged from the photoelectric conversion layer 205.

In the state illustrated in FIG. 5C, the buffer circuit 12a supplies the first potential Vd1 to the capacitative element 12b. The potential gradient of the photoelectric conversion layer 205 is inverted again. The electrons injected into the photoelectric conversion layer 205 in the state illustrated in FIG. 5B are therefore discharged from the photoelectric conversion layer 205. On the other hand, the blocking layer 203 reduces the number of holes injected from the first electrode 201 into the photoelectric conversion layer 205. The potential of the node FD is changed from a reset potential by a potential Vsig corresponding to the number of disappeared holes. That is, the potential Vsig corresponding to the number of holes stored as signal charges appears at the node FD. The potential Vsig corresponding to the number of stored holes is hereinafter referred to as an optical signal component.

In the state illustrated in FIG. 5C, the selection transistor 16b is turned on. As a result, the first amplification transistor 16a outputs an optical signal. The difference between the noise signal read in step (2) and the optical signal read in step (4) is a signal based on the potential Vsig corresponding to stored signal charges.

Figure 5D:
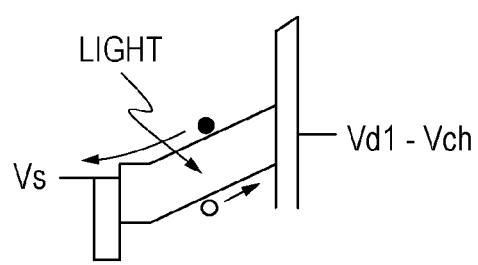

FIG. 5D illustrates the state of the photoelectric conversion unit 101a in step (5). The potential Vs is supplied to the first electrode 201, and the reset potential Vres is supplied to the node FD. Since the reset potential Vres is lower than the potential Vs of the first electrode 201, electrons are discharged from the photoelectric conversion layer 205 to the first electrode 201. On the other hand, holes in the photoelectric conversion layer 205 moves toward the interface between the photoelectric conversion layer 205 and the insulating layer 207. However, since holes cannot move to the insulating layer 207, the holes are stored in the photoelectric conversion layer 205. As described previously, the blocking layer 203 suppresses the injection of holes into the photoelectric conversion layer 205. Accordingly, when light enters the photoelectric conversion layer 205 in this state, only holes in electron-hole pairs generated by photoelectric conversion are stored in the photoelectric conversion layer 205 as signal charges. A potential Vch is the potential of the second electrode 209 changed in accordance with the number of holes stored in the photoelectric conversion layer 205.

When signal charges are electrons, the second potential Vd2 is set to a potential lower than the first potential Vd1. The conductive type of the blocking layer 203 is set to a conductive type opposite to that of the blocking layer 203 according to this embodiment. The potential gradients illustrated in FIG. 5A to 5D are inverted. The other operations are not changed.

Figure 6:
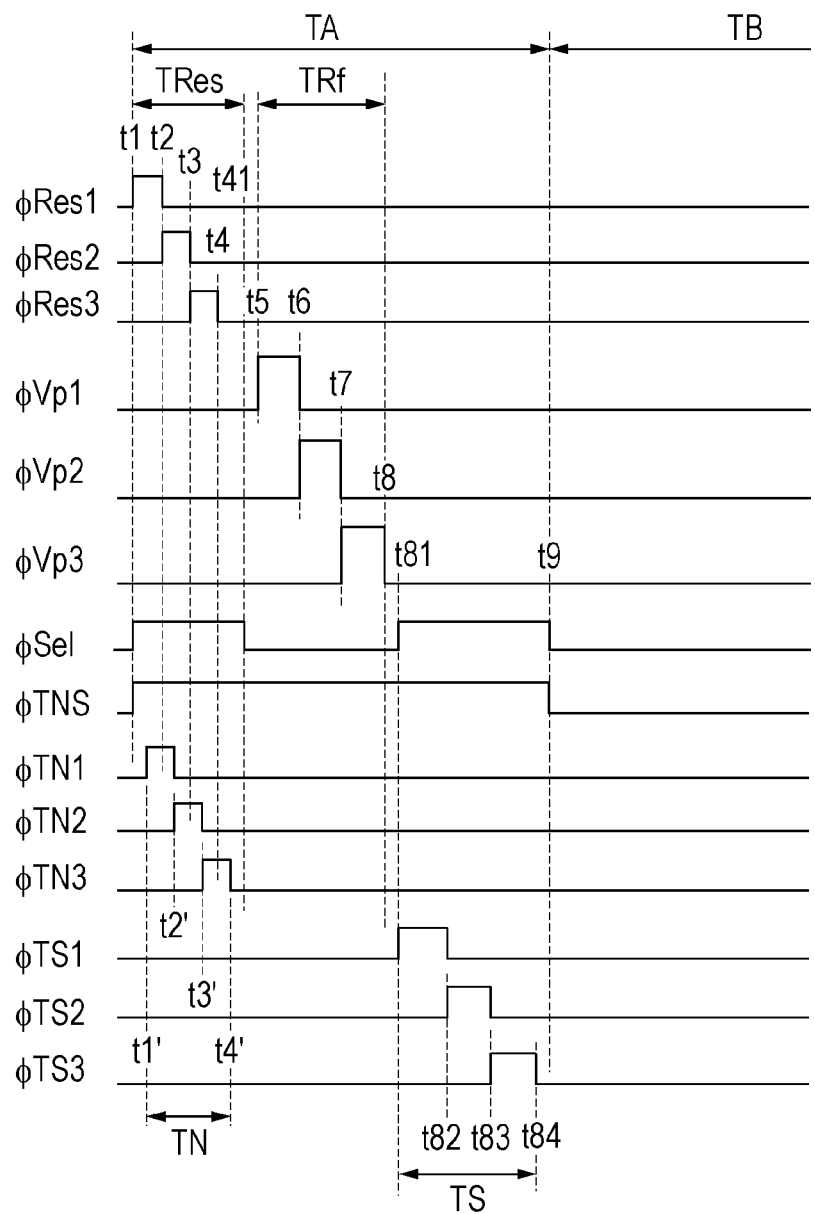
FIG. 6 is a diagram illustrating another exemplary operation of a photoelectric conversion apparatus.

FIG. 6 is a timing diagram illustrating the operation of the photoelectric conversion apparatus illustrated in FIG. 4A. Signals ϕVp1, ϕVp2, and ϕVp3 illustrated in FIG. 6 are supplied by the driving signal supply unit 4 to the pixels 10 in the first group, the second group, and the third group, respectively, as the signal ϕVp illustrated in FIG. 4A.

The period TRes illustrated in FIG. 6 is the same as that illustrated in FIG. 3. That is, while the node FD is reset, the pixel processing unit 20 samples a noise signal.

The operation of a photoelectric conversion apparatus in the period TRf will be described.

At a time t41, the driving signal supply unit 4 sets the signal level of the signal ϕSel to Lo. As a result, the selection transistor 16b is turned off. In a period TRf from a time t5 to a time t8, the driving signal supply unit 4 changes the signal levels of the signals ϕVp1, ϕVp2, and ϕVp3 to Hi. As a result, the photoelectric conversion layer 205 is completely depleted. The node FD therefore has a potential based on charges stored in the photoelectric conversion layer 205.

The driving signal supply unit 4 sequentially sets the signal levels of the signals ϕVp1, ϕVp2, and ϕVp3 to Lo at times t6, t7, and t8, respectively.

That is, at the time t6, the driving signal supply unit 4 changes the signal level of the signal ϕVp1 from Hi to Lo and the signal level of the signal ϕVp2 from Lo to Hi. At the time t7, the driving signal supply unit 4 changes the signal level of the signal ϕVp2 from Hi to Lo and the signal level of the signal ϕVp3 from Lo to Hi.

Thus, a photoelectric conversion apparatus according to this embodiment sets a period in which the signal level of the signal ϕVp is set to Hi for each group of the pixels 10. A photoelectric conversion apparatus according to this embodiment can therefore divide the load on the driving signal supply unit 4 for supplying the signal ϕVp among a plurality of periods. Consequently, a photoelectric conversion apparatus according to this embodiment can more rapidly switch between the signal levels of the signal ϕVp than a photoelectric conversion apparatus that supplies the common signal ϕVp to all of the pixels 10.

At the time 6, the driving signal supply unit 4 makes a time at which the potential magnitude relationship between the first electrode and the second electrode in pixels in the first group is changed from the first relationship obtained in the period in which signal charges are discharged from the photoelectric conversion layer 205 to the second relationship opposite to the first relationship and a time at which the potential magnitude relationship between the first electrode and the second electrode in pixels in the second group is changed from the second relationship obtained in the period in which the photoelectric conversion layer 205 stores signal charges to the first relationship opposite to the second relationship overlap each other. As a result, the change in the potential of the node FD in the pixels 10 in the first group which occurs by the change in the signal level of the signal φVp1 from Hi to Lo is canceled by the change in the potential which occurs by the change in the signal level of the signal φVp2 from Lo to Hi. Accordingly, the change in the potential of the node FD in the pixels 10 in the first group which occurs by the change in the signal level of the signal φVp1 from Hi to Lo can be more rapidly converged as compared with a configuration in which there is no overlap between the change in the signal level of the signal φVp1 from Hi to Lo and the change in the signal level of the signal φVp2 from Lo to Hi. Consequently, a photoelectric conversion apparatus according to this embodiment can enhance the accuracy of an optical signal read after a time t81.

At the time t8, the node FD in each pixel 10 in all rows has a potential based on charges stored in the photoelectric conversion layer 205.

In a period from the time t81 to a time t9, the driving signal supply unit 4 sets the signal level of the signal φSel to Hi. In a period TS from the time t81 to a time t84, the driving signal supply unit 4 sequentially sets the signal levels of the signals φTS1, φTS2, and φTS3 to Hi. As a result, the storage of an optical signal in the capacitative element CS is sequentially performed in the pixels 10 in the first group, the second group, and the third group. At the time t84, the capacitative element CS in each pixel 10 in all rows stores an optical signal. In a period TB, the vertical scanning circuit 3 causes the pixels 10 in each row to output corresponding optical signals and corresponding noise signals to the column signal processing circuit.

Like in the above-described embodiment, in a photoelectric conversion apparatus according to this embodiment, the pixel processing unit 20 samples a noise signal while the node FD is reset. This leads to the reduction in the dark current component of the node FD included in a noise signal.

Like in the above-described embodiment, in a photoelectric conversion apparatus according to this embodiment, a photoelectric conversion apparatus according to this embodiment varies the time at which the signal level of the signal φRes, which is one of driving signals, is changed from Lo to hi from group to group. Like in a photoelectric conversion apparatus according to the first embodiment, the column signal processing circuit can output a signal obtained by accurately subtracting the noise signal from the optical signal.

In a photoelectric conversion apparatus according to this embodiment, the driving signal supply unit 4 sets the signal level of the signal φSel to Lo when setting the signal level of the signal φVp to Hi. That is, the first pixel output unit 16 is brought into a nonoperating state in a period in which the potential relationship between the first electrode 201 and the second electrode 209 in the photoelectric conversion unit 101a is set to a relationship opposite to that in the period TRes and is set back to the same relationship as that in the period TRes. As a result, the change in the potential of the node B connected to the gate of the second amplification transistor 25a can be suppressed. On the other hand, when the signal level of the signal φSel is set to Hi, the potential of the node B is changed in accordance with the change in the signal level of the signal φVp. It takes a time to stabilize the potential of the node B after the signal level of the signal φVp has been set from Hi to Lo. When a standby time until the stabilization of the potential of the node B is provided in a photoelectric conversion apparatus, it is difficult for the photoelectric conversion apparatus to achieve an enhanced speed. On the other hand, when this standby time is not provided in a photoelectric conversion apparatus, the second pixel output unit 25 outputs a noise signal stored in the capacitative element CN to the vertical signal line 17 in a state in which the potential of the node B is not stabilized. The signal level of the noise signal output to the vertical signal line 17 is therefore changed from the signal level of a noise signal assumed to be output when the potential of the node B is stabilized. The column signal processing circuit cannot accurately subtract the noise signal from an optical signal. On the other hand, as described previously, since a photoelectric conversion apparatus according to this embodiment can suppress the change in the potential of the node B caused by the change in the signal level of the signal φVp, the second pixel output unit 25 can accurately the noise signal stored in the capacitative element CN even through a standby time until the change in the potential of the node B is stabilized is not provided. A photoelectric conversion apparatus according to this embodiment can achieve higher speed than a photoelectric conversion apparatus having a configuration in which the signal level of the signal φSel is set to Hi during the change in the signal level of the signal φVp.

Figure 4B:
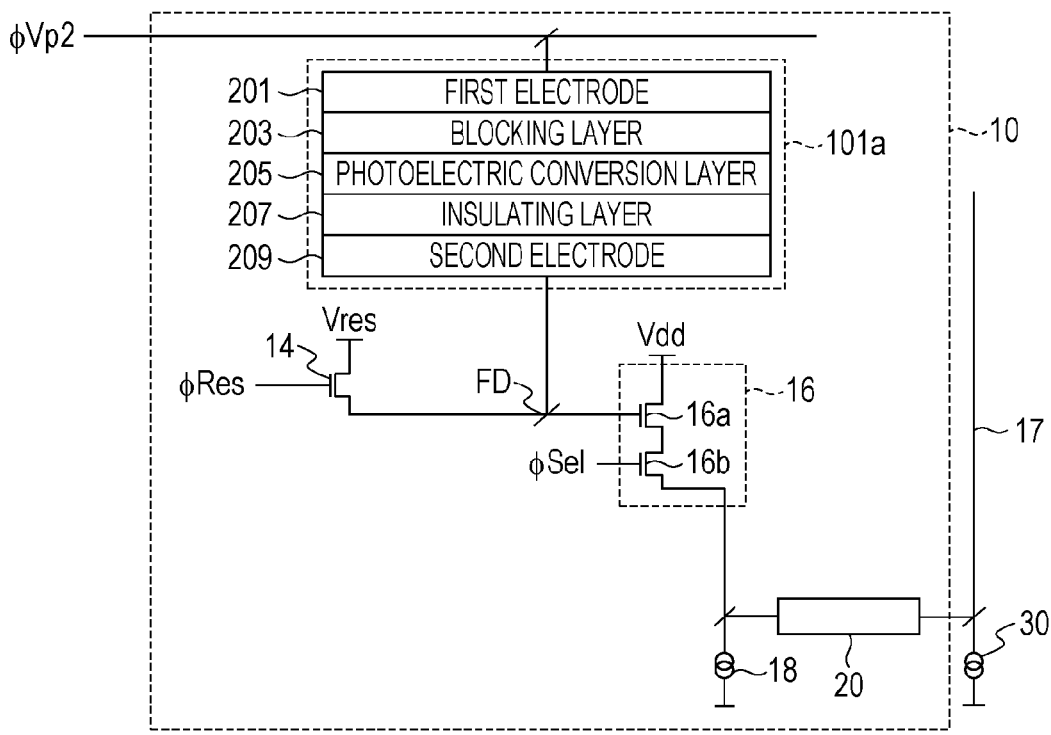
FIG. 4B is a diagram illustrating another exemplary configuration of a pixel.

In this embodiment, an exemplary case in which the potential of the second electrode 209 is changed in accordance with the signal level of the signal φVp has been described. However, as illustrated in FIG. 4B, the potential of the first electrode 201 may be changed in accordance with the signal level of the signal φVp2. In this case, like in the above-described case, a time at which the signal level of the signal φVp2 to be supplied to the pixels 10 in the first group is changed from Hi to Lo and a time at which the signal level of the signal φVp2 to be supplied to the pixels 10 in the second group is changed from Lo to Hi are made overlap each other.

In addition, in the period TRf, the potential magnitude relationship between the first electrode 201 and the second electrode 209 is set using the signal φVp2 so that it is opposite to the potential magnitude relationship between the first electrode 201 and the second electrode 209 in the period TRes.

Third Embodiment

A photoelectric conversion apparatus according to this embodiment will be described focusing on difference points between the second embodiment and the third embodiment. The configuration of a photoelectric conversion apparatus according to this embodiment is the same as that described in the second embodiment with reference to FIG. 4.

Figure 7:
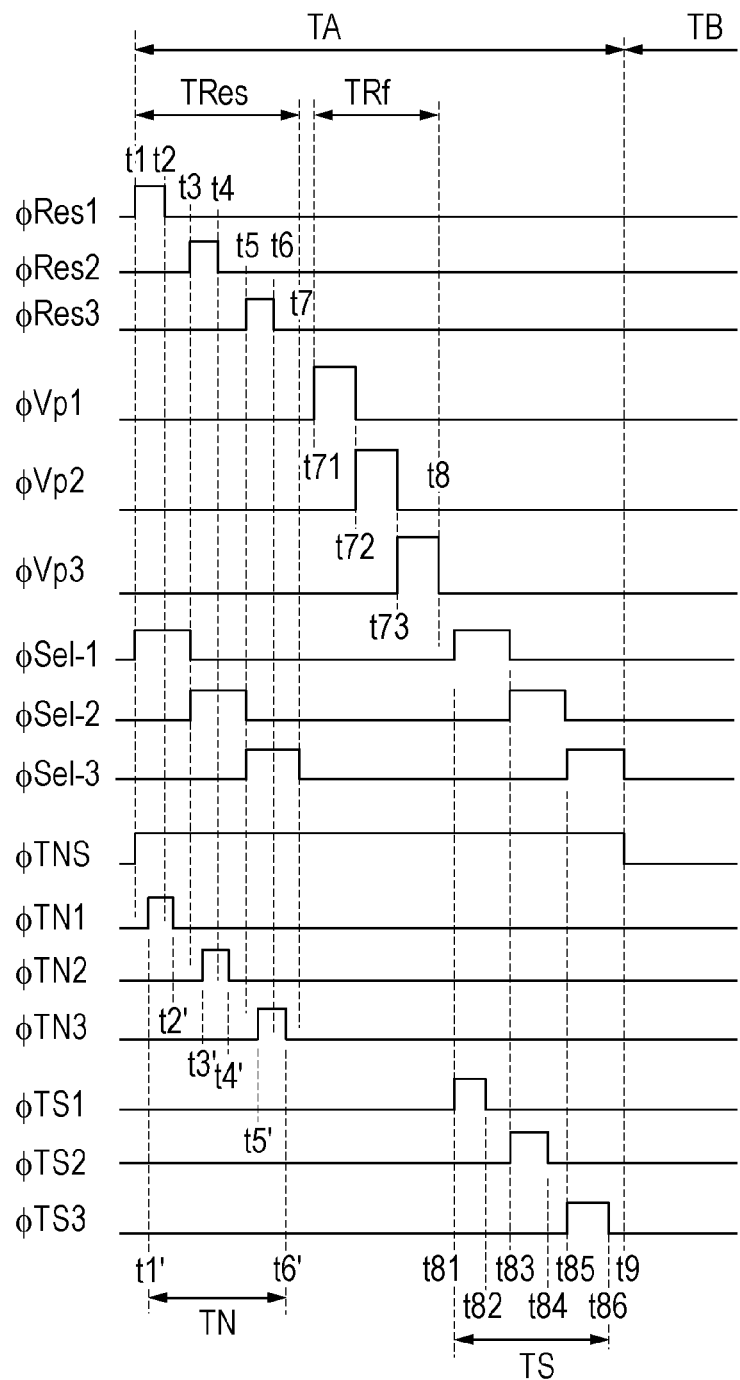
FIG. 7 is a diagram illustrating another exemplary operation of a photoelectric conversion apparatus.

FIG. 7 is a timing diagram illustrating the operation of a photoelectric conversion apparatus according to this embodiment. A photoelectric conversion apparatus according to this embodiment sets a period in which the signal level of the signal φSel is set to Hi for each group of the pixels 10.

In a period from a time t1 to t3, since the signal level of the signal φSel-1 is set to Hi, the first amplification transistor 16a is brought into an operating state in pixel rows in the first group. In a period from the time t1 to the time t2, the driving signal supply unit 4 changes the signal level of the signal Res1 from Lo to Hi. As a result, the potential of the node FD is reset. At a time t1' in the period from the time t1 to the time t2, the driving signal supply unit 4 changes the signal level of the signal φTN1 to Hi. As a result, the first pixel output unit 16 in each pixel 10 in the first group outputs a noise signal to the capacitive element CN. At a time t2' in a period from the time t2 to the time t3, the capacitive element CN in each pixel 10 in the first group stores the noise signal.

In a period TRf, the driving signal supply unit 4 sequentially sets the signal levels of the signals φVp1, φVp2, and φVp3 to Hi. As a result, at a time t81, the node FD in each pixel 10 in all rows illustrated in FIG. 1 has a potential based on signal charges that is stored by the photoelectric conversion unit 101a in accordance with incident light.

In a period from a time t6' to the time t81, the signal level of the signal φSel is Lo.

In a period from the time t81 to a time t83, the driving signal supply unit 4 changes the signal level of the signal φSel-1 to Hi. In a period from the time t81 to the time t82, the driving signal supply unit 4 changes the signal level of the signal φTS1 to Hi. At the time t82, the driving signal supply unit 4 changes the signal level of the signal φTS1 to Lo. As a result, the capacitive element CS in each pixel 10 in the first group stores an optical signal.

At the time t83, the driving signal supply unit 4 sets the signal levels of the signals φSel-2 and TS2 to Hi. At a time t84, the driving signal supply unit 4 sets the signal level of the signal TS2 to Lo. As a result, the capacitive element CS in each pixel 10 in the second group stores an optical signal. At a time t85, the driving signal supply unit 4 sets the signal levels of the signals φSel-3 and TS3 to Hi. At a time t86, the driving signal supply unit 4 sets the signal level of the signal TS3 to Lo. As a result, the capacitive element CS in each pixel 10 in the third group stores an optical signal.

In a photoelectric conversion apparatus according to this embodiment, the switching between the operating state and the nonoperating state of the first pixel output unit 16 is performed for each group of the pixels 10. In a period in which the signal level of the signal φTS for a predetermined group is set to Hi, the first pixel output units 16 in the other groups are brought into the nonoperating state. Accordingly, it is possible to reduce current consumption as compared with the operation illustrated in FIG. 6.

Like in the above-described operation, in the operation illustrated in FIG. 7, at a time t72, the driving signal supply unit 4 makes a time at which the potential magnitude relationship between the first electrode and the second electrode in pixels in the first group is changed to a relationship opposite to a relationship obtained in the period in which signal charges are discharged from the photoelectric conversion layer 205 and a time at which the potential magnitude relationship between the first electrode and the second electrode in pixels in the second group is changed to a relationship opposite to a relationship obtained in the period in which the photoelectric conversion layer 205 stores signal charges overlap each other. As a result, the change in the potential of the node FD in the pixels 10 in the first group which occurs by the change in the signal level of the signal φVp1 from Hi to Lo is canceled by the change in the potential which occurs by the change in the signal level of the signal φVp2 from Lo to Hi. Accordingly, the change in the potential of the node FD in the pixels 10 in the first group which occurs by the change in the signal level of the signal φVp1 from Hi to Lo can be more rapidly converged as compared with a configuration in which there is no overlap between the change in the signal level of the signal φVp1 from Hi to Lo and the change in the signal level of the signal φVp2 from Lo to Hi. Consequently, a photoelectric conversion apparatus according to this embodiment can enhance the accuracy of an optical signal read after the time t81.

The above-described switching between the operating state and the nonoperating state of the first pixel output unit 16 performed in units of groups can be applied to a photoelectric conversion apparatus according to the first embodiment.

Next, another operation of a photoelectric conversion apparatus according to this embodiment will be described.

Figure 8:
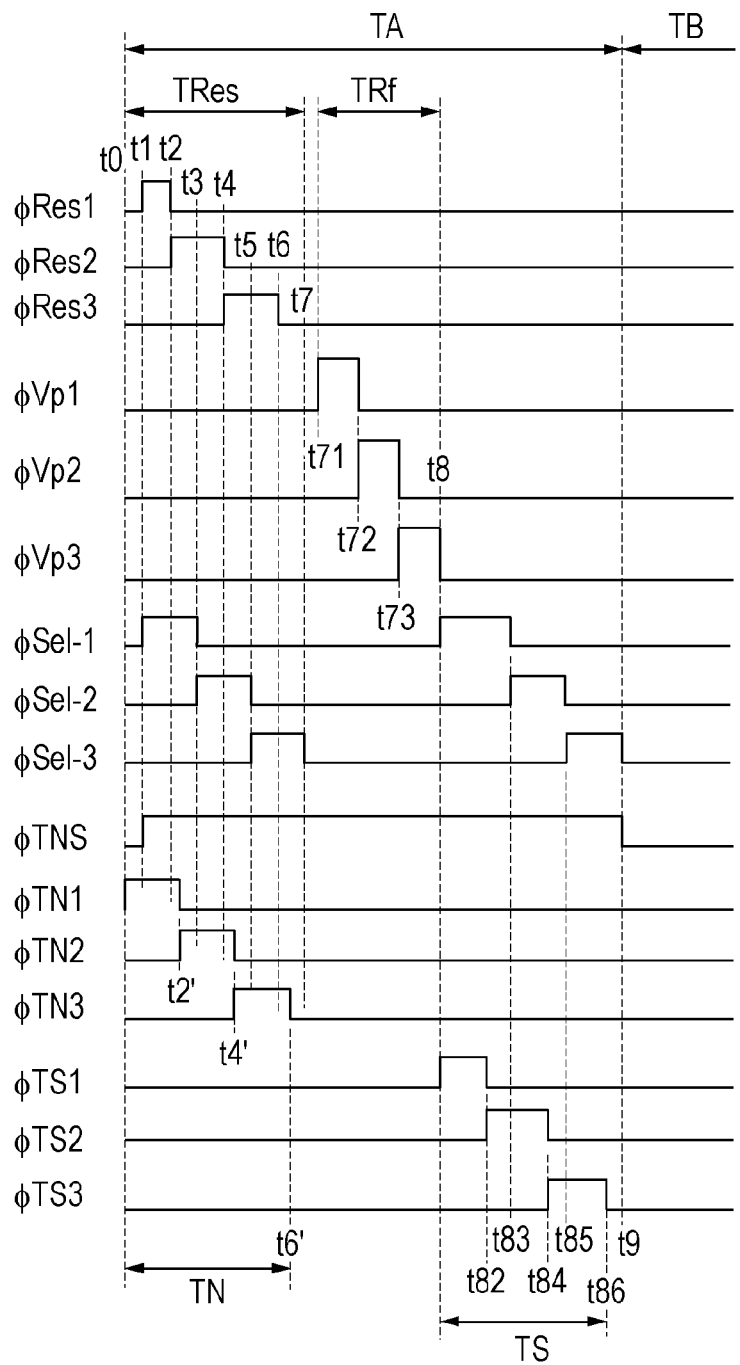
FIG. 8 is a diagram illustrating another exemplary operation of a photoelectric conversion apparatus.

FIG. 8 is a timing diagram illustrating another operation of a photoelectric conversion apparatus according to this embodiment.

Difference points between this timing diagram and the timing diagram illustrated in FIG. 7 will be mainly described below. Referring to FIG. 8, a time at which the signal level of the signal φRes1 is changed from Hi to Lo and a time at which the signal level of the signal φRes2 is changed from Lo to Hi are the same. In addition, a time at which the signal level of the signal φRes2 is changed from Hi to Lo and a time at which the signal level of the signal φRes3 is changed from Lo to Hi are the same. As a result, a current that occurs by the change in the signal level of the signal φRes1 from Hi to Lo and flows between the reset transistor 14 and a line for supplying the voltage Vd1 and a current that occurs by the change in the signal level of the signal φRes2 from Lo to Hi and flows between the reset transistor 14 and the line for supplying the voltage Vd1 can cancel each other. The change in the potential of the voltage Vd1 caused by the changes in the signal levels of the signals φRes1 and φRes2 can therefore be reduced, and the change in the potential of the node FD caused by the change in the voltage Vd1 can therefore be suppressed. Consequently, the signal-to-noise ratio of an optical signal output by the pixel 10.

In this embodiment, a period in which the signal φSel is set to Hi and a period in which the signal φRes is set to Hi vary from group to group. However, in a photoelectric conversion apparatus according to this embodiment, a period in which the signal level of the signal φVp is set to Hi may vary from group to group. That is, the period in which the signal φSel is set to Hi may be the same in all groups, and the period in which the signal φRes is set to Hi may be the same in all groups.

Fourth Embodiment

Photoelectric conversion apparatuses described in the first to third embodiments can be applied to various photoelectric conversion systems. Examples of a photoelectric conversion system include a digital still camera, a digital camcorder, and a surveillance camera. FIG. 9 is a schematic diagram of a digital still camera that is an example of a photoelectric conversion system to which a photoelectric conversion apparatus according to the first, second, or third embodiment is applied.

Figure 11:
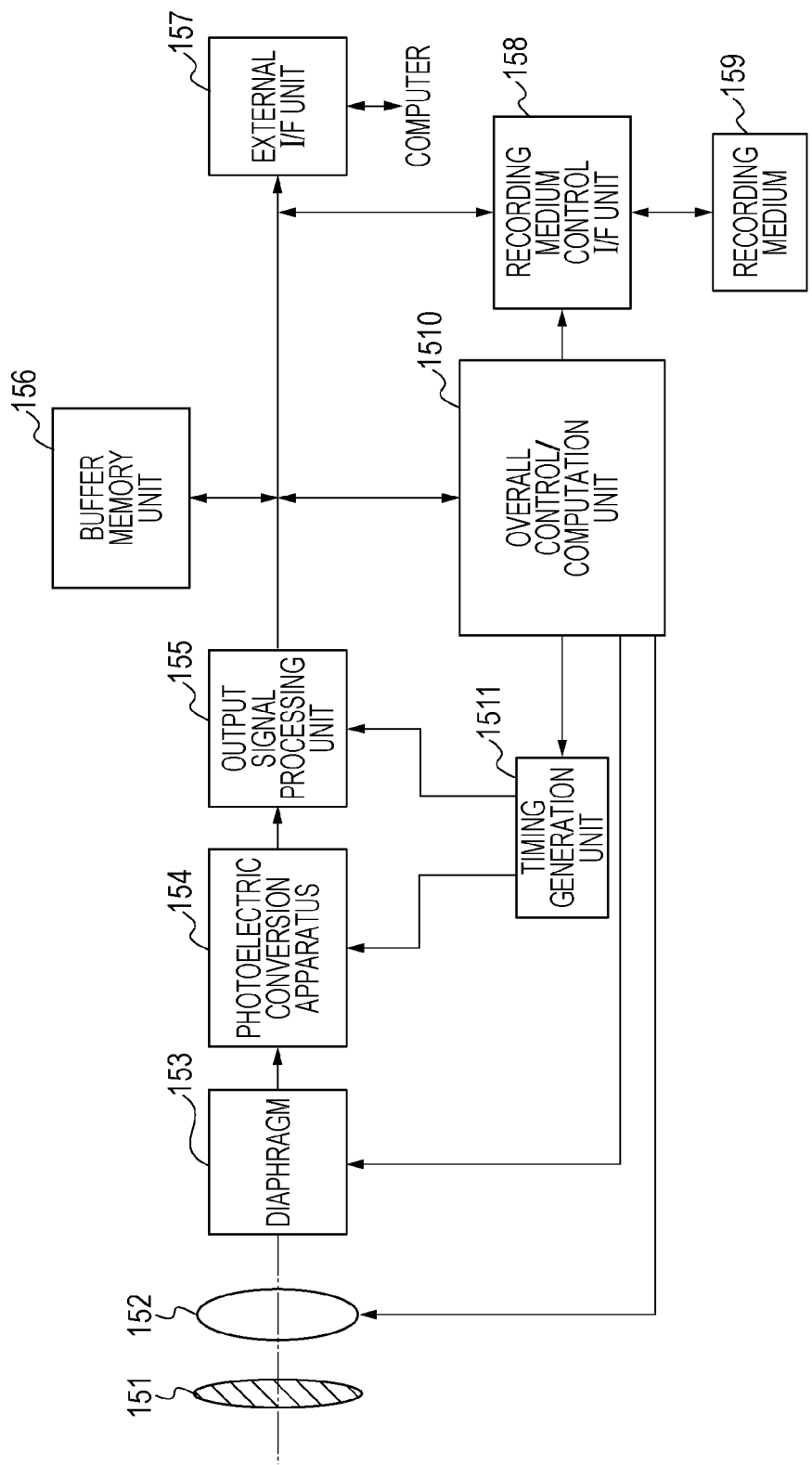
FIG. 11 is a diagram illustrating an exemplary configuration of a photoelectric conversion system.

A photoelectric conversion system illustrated in FIG. 11 includes a photoelectric conversion apparatus 154, a barrier 151 for protecting a lens, a lens 152 for forming an optical image of a subject on the photoelectric conversion apparatus 154, and a diaphragm 153 for changing the amount of light passing through the lens 152. The lens 152 and the diaphragm 153 are optical systems for concentrating light on the photoelectric conversion apparatus 154. The photoelectric conversion system illustrated in FIG. 11 further includes an output signal processing unit 155 for processing a signal output from the photoelectric conversion apparatus 154.

The output signal processing unit 155 converts an analog signal output from the photoelectric conversion apparatus 154 into a digital signal. In addition, the output signal processing unit 155 performs various corrections and various compressions as needed and outputs image data.

The photoelectric conversion system illustrated in FIG. 11 further includes a buffer memory unit 156 for temporarily storing image data, an external interface (I/F) unit 157 for communicating with an external computer, a recording medium 159 such as a semiconductor memory in which image data is recorded or from which image data is read, and a recording medium control I/F unit 158 used for the recording of image data in the recording medium 159 or the reading of image data from the recording medium 159. The recording medium 159 may be built into the photoelectric conversion system or may be detachable.

The photoelectric conversion system further includes an overall control/computation unit 1510 for performing various pieces of computation and overall control of the digital still camera and a timing generation unit 1511 for outputting various timing signals to the photoelectric conversion apparatus 154 and the output signal processing unit 155. Timing signals may be externally input into the photoelectric conversion system. Accordingly, the photoelectric conversion system may include at least the photoelectric conversion apparatus 154 and the output signal processing unit 155 for processing a signal output from the photoelectric conversion apparatus 154. Thus, a photoelectric conversion system according to this embodiment can perform an image capturing operation using the photoelectric conversion apparatus 154.

In the above-described embodiments, exemplary cases where the signal levels of signals output from the vertical scanning circuit 3 and the driving signal supply unit 4 are rapidly changed have been described. An embodiment of the present invention is not limited to these cases. It may take a time to change signals output from the vertical scanning circuit 3 and the driving signal supply unit 4 from Lo to Hi or from Hi to Lo. In this case, an exemplary case where the signal level of a second signal is changed from Lo to Hi in a period in which the signal level of a first signal is changed from Hi to Lo falls within the scope of the concept that the signal level of the second signal is changed at the timing of the change in the signal level of the first signal.

According to an embodiment of the present invention, the signal-to-noise ratio of a signal output from a pixel can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-163207, filed Aug. 8, 2014, which is hereby incorporated by reference herein in its entirety.

What is claimed is:

1. A photoelectric conversion apparatus comprising: a control unit and a plurality of pixels each including a photoelectric conversion unit,
the photoelectric conversion unit including,
a first electrode,
a second electrode,
a photoelectric conversion layer that is disposed between the first electrode and the second electrode and is configured to store signal charges, and
an insulating layer disposed between the photoelectric conversion layer and the second electrode,
wherein the control unit sets, in a part of the plurality of pixels, a magnitude relationship between a potential of the first electrode and a potential of the second electrode, in a first relationship in which a potential of the first electrode is lower than a potential of the second electrode,
the control unit changes, in the part of the plurality of pixels, the magnitude relationship from the first relationship to a second relationship opposite to the first relationship, in a period,
the control unit sets, in other part of the plurality of pixels, the magnitude relationship in the second relationship; and
the control unit changes, in the other part of the plurality of pixels, the magnitude relationship from the second relationship to the first relationship, in the period.

2. The photoelectric conversion apparatus according to claim 1, each of the plurality of pixels further comprising a pixel output unit having an input node,
wherein the control unit terminates resetting of the input node in the part of the plurality of pixels, and starts resetting of the input node in the other part of the plurality of pixels are performed at the same time.

3. The photoelectric conversion apparatus according to claim 1, each of the plurality of pixels further comprising a pixel output unit having an input node,
wherein, during a reset of the input node in the part of the plurality of pixels, the pixel output unit is in an operating state in the part of the plurality of pixels and the pixel output unit is in a nonoperating state in the other part of the plurality of pixels, and
wherein, during a reset of the input node in the other part of the plurality of pixels, the pixel output unit is in an operating state in the other part of the plurality of pixels and the pixel output unit is in the nonoperating state in the part of the plurality of pixels.

4. The photoelectric conversion apparatus according to claim 1, each of the plurality of pixels further comprising a pixel output unit having an input node,
wherein each of the plurality of pixels further includes a current source, and
wherein the pixel output unit and a current source form a source follower circuit.

5. The photoelectric conversion apparatus according to claim 1, further comprising a signal line connected to the plurality of pixels, and each of the plurality of pixels further comprising a pixel output unit having an input node,
wherein each of the plurality of pixels further includes,
a signal storage unit configured to store a signal that is output by the pixel output unit in accordance with a potential of the input node, and
a second pixel output unit configured to output the signal stored by the signal storage unit to the signal line.

6. The photoelectric conversion apparatus according to claim 5, further comprising a second current source configured to supply a current to the signal line,
wherein the second pixel output unit and the second current source form a source follower circuit.

7. The photoelectric conversion apparatus according to claim 1, each of the plurality of pixels further comprising a pixel output unit having an input node,
wherein each of the plurality of pixels further includes a signal storage unit configured to store a noise signal and the optical signal which are output by the pixel output unit, the signal storage unit including a capacitative element configured to store the noise signal.

8. The photoelectric conversion apparatus according to claim 1, wherein the photoelectric conversion layer includes a quantum dot.

9. A photoelectric conversion system comprising:
a photoelectric conversion apparatus; and
an output signal processing unit configured to process a signal output by the photoelectric conversion apparatus,
the photoelectric conversion apparatus including a control unit and a plurality of pixels each including a photoelectric conversion unit,
the photoelectric conversion unit including,
a first electrode,
a second electrode,
a photoelectric conversion layer that is disposed between the first electrode and the second electrode and is configured to store signal charges, and
an insulating layer disposed between the photoelectric conversion layer and the second electrode,
wherein
the control unit sets, in a part of the plurality of pixels, a magnitude relationship between a potential of the first electrode and a potential of the second electrode, in a first relationship in which a potential of the first electrode is lower than a potential of the second electrode,
the control unit changes, in the part of the plurality of pixels, the magnitude relationship from the first relationship to a second relationship opposite to the first relationship, in a period,
the control unit sets, in other part of the plurality of pixels, the magnitude relationship in the second relationship; and
the control unit changes, in the other part of the plurality of pixels, the magnitude relationship from the second relationship to the first relationship, in the period.

10. A method for driving a photoelectric conversion apparatus including a plurality of pixels each including a photoelectric conversion unit and a pixel output unit,
the photoelectric conversion unit including,
a first electrode,
a second electrode,
a photoelectric conversion layer that is disposed between the first electrode and the second electrode and is configured to store signal charges, and
an insulating layer disposed between the photoelectric conversion layer and the second electrode,
the method comprising:
setting, by a control unit, in a part of the plurality of pixels, a magnitude relationship between a potential of the first electrode and a potential of the second electrode, in a first relationship in which a potential of the first electrode is lower than that of the second electrode;
changing, by the control unit, in the part of the plurality of pixels, the magnitude relationship from the first relationship to a second relationship opposite to the first relationship, in a period;
setting, by the control unit, in other part of the plurality of pixels, the magnitude relationship in the second relationship; and
changing, by the control unit, in the other part of the plurality of pixels, the magnitude relationship from the second relationship to the first relationship, in the period.

11. The method according to claim 10, further comprising: terminating reset of the input node in the part of the plurality of pixels by the control unit; and
starting reset of the input node in the other part of the plurality of pixels are performed at the same time by the control unit.

12. The method according to claim 10, further comprising:
setting, during a reset of the input node in the part of the plurality of pixels, the pixel output unit in an operating state in the part of the plurality of pixels and the pixel output unit in a nonoperating state in the other part of the plurality of pixels; and
setting, during a reset of the input node in the other part of the plurality of pixels, the pixel output unit in an operating state in the other part of the plurality of pixels, and the pixel output unit in the nonoperating state in the part of the plurality of pixels.

13. The method according to claim 10,
wherein each of the plurality of pixels further includes a current source and a pixel output unit,
wherein the method further comprises,
forming a source follower circuit, by the pixel output unit and a current source.

14. The method according to claim 10, wherein the photoelectric conversion apparatus further comprises a signal line connected to the plurality of pixels,
wherein each of the plurality of pixels further includes a signal storage unit, a pixel output unit having an input node and a second pixel output unit,
wherein the method comprises,
outputting, by the pixel output unit, a signal in accordance with a potential of the input node,
storing the signal by the signal storage unit,
outputting, by a second pixel output unit, the signal stored by the signal storage unit to the signal line.

15. The method according to claim 14, wherein the photoelectric conversion apparatus further comprises a second current source configured to supply a current to the signal line,
wherein the method comprises,
forming a source follower circuit by the second pixel output unit and the second current source.

16. The method according to claim 10, wherein each of the plurality of pixels further includes a first capacitative element and a second capacitative element,
wherein the method comprises,
storing a optical signal by the first capacitative element,
storing a noise signal by the second capacitative element.

17. The method according to claim 10, wherein, in the photoelectric conversion apparatus, the photoelectric conversion layer includes a quantum dot.

* * * * *